United States Patent [19]

Farnworth et al.

[11] Patent Number: 5,495,667
[45] Date of Patent: Mar. 5, 1996

[54] METHOD FOR FORMING CONTACT PINS FOR SEMICONDUCTOR DICE AND INTERCONNECTS

[75] Inventors: Warren M. Farnworth, Nampa; Salman Akram; Alan G. Wood, both of Boise, all of Id.

[73] Assignee: Micron Technology, Inc., Boise, Id.

[21] Appl. No.: 335,262

[22] Filed: Nov. 7, 1994

[51] Int. Cl.⁶ .................................................. H01R 9/06
[52] U.S. Cl. ............................ 29/843; 179/260; 257/780; 257/784; 437/8
[58] Field of Search .............................. 427/96; 257/784; 437/8; 228/4.5; 29/843

[56] References Cited

U.S. PATENT DOCUMENTS

| | | | |
|---|---|---|---|
| 3,006,067 | 10/1961 | Anderson et al. | 257/784 X |
| 3,227,933 | 1/1966 | Punte et al. | 257/780 |
| 3,266,137 | 8/1966 | Mille et al. | 257/780 X |
| 3,381,081 | 4/1968 | Schalliol | 174/260 |
| 3,894,671 | 7/1975 | Kukicke, Jr. et al. | 228/4.5 |
| 4,060,828 | 11/1977 | Satonaka | 257/784 X |
| 4,434,347 | 2/1984 | Kurtz et al. | 219/56.22 |
| 4,873,123 | 10/1989 | Canestaro et al. | 427/96 |
| 4,877,173 | 10/1989 | Fujimoto et al. | 228/1.1 |
| 5,266,912 | 11/1993 | Kledzik | 333/247 |
| 5,293,073 | 3/1994 | Ono | 257/780 X |
| 5,302,891 | 4/1994 | Wood et al. | 324/158 F |
| 5,366,589 | 11/1994 | Chang | 257/784 X |

FOREIGN PATENT DOCUMENTS 58-9330  1/1983  Japan ........................................ 437/8

*Primary Examiner*—Carl J. Arbes
*Attorney, Agent, or Firm*—Stephen A. Gratton

[57] ABSTRACT

A method for forming contact pins adapted to form an electrical connection with a mating contact location is provided. In a first embodiment, the contact pins are formed on an interconnect used for testing a semiconductor die and are adapted to establish an electrical connection with the bond pads of the die. In a second embodiment, the contact pins are formed directly on the bond pads of a die and can be used for establishing a permanent or temporary electrical connection to the pads. The contact pins include a base portion attached to the die or interconnect, a compliant spring segment, and a contact ball at the tip. The contact pins are formed using a wire bonding process or a welding process in which a metal wire is simultaneously heated and shaped into a compliant structure as it is attached to the die or interconnect.

30 Claims, 5 Drawing Sheets

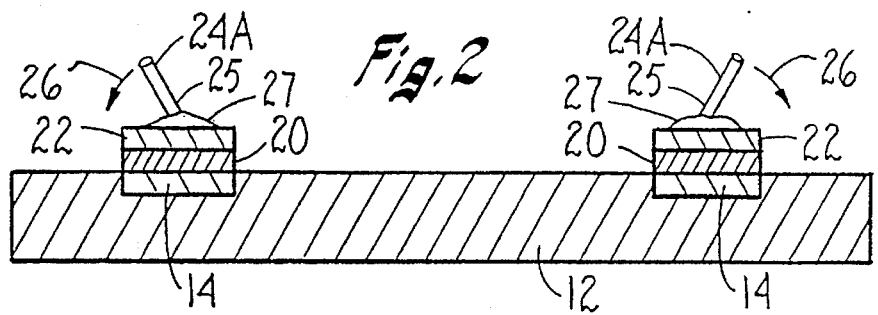
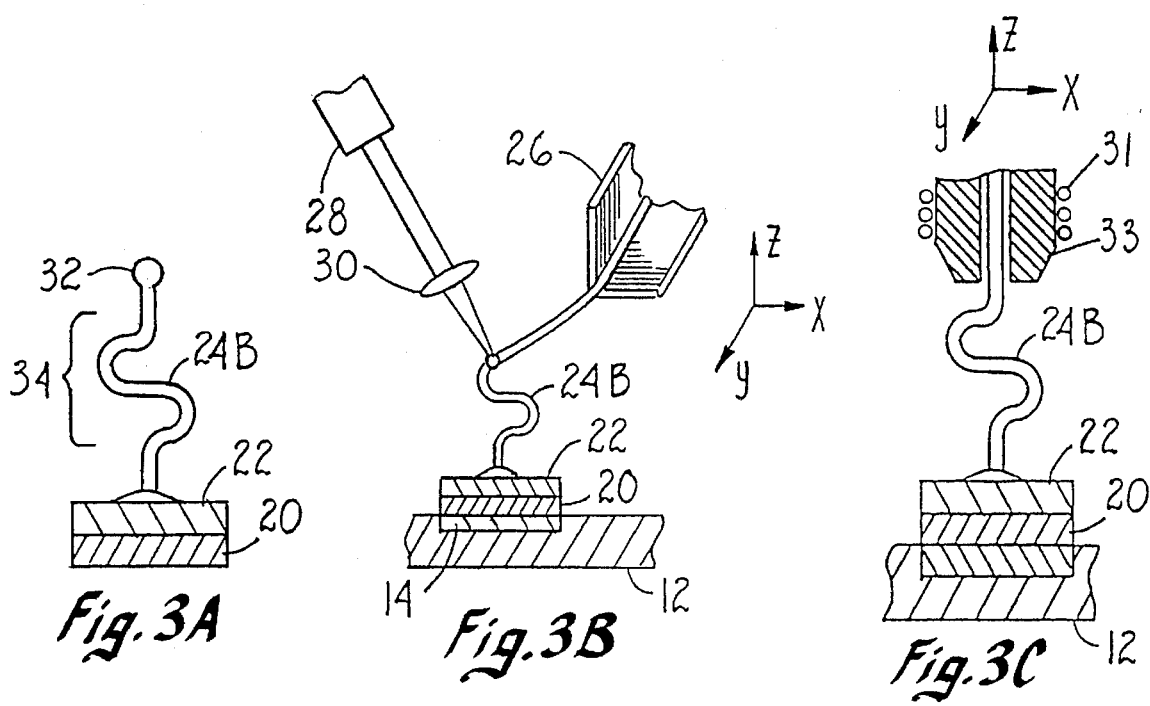
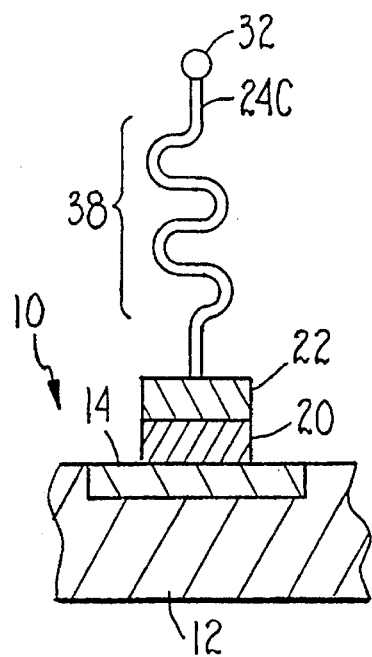
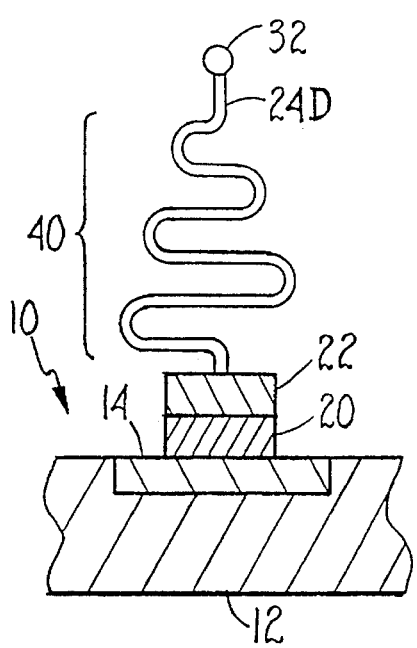

METHOD FOR FORMING CONTACT PINS FOR SEMICONDUCTOR DICE AND INTERCONNECTS

FIELD OF THE INVENTION

This invention relates generally to semiconductor manufacture and more particularly to a method for forming compliant metal contact pins on active semiconductor dice and silicon interconnects. The contact pins are particularly suited to testing unpackaged die in the manufacture of known good die (KGD).

BACKGROUND OF THE INVENTION

Bare or unpackaged semiconductor dice are used extensively in the manufacture of electronic devices. Known-good-die (KGD) is a collective term that connotes unpackaged dice having the same quality and reliability as the equivalent packaged product. The demand for known-good-die has led to the development of test procedures for testing unpackaged semiconductor dice.

For test and burn-in of an unpackaged die, a carrier replaces a conventional single chip package in the testing process. The carrier typically includes an interconnect element that allows a temporary electrical connection to be made between the die and external test circuitry. In addition, such a carrier must allow the necessary test procedures to be performed without damaging the die. The bond pads on a die are particularly susceptible to damage during the test procedure.

Recently semiconductor manufacturers have developed carriers for testing discrete, unpackaged die. Different types of carriers are disclosed in U.S. Pat. No. 4,899,107 to Corbett et al. and U.S. Pat. No. 5,302,891 to Wood et al., which are assigned to Micron Technology, Inc., and in U.S. Pat. No. 5,123,850 to Elder et al., and U.S. Pat. No. 5,073,117 to Malhi et al., which are assigned to Texas Instruments.

One of the key design considerations for a carrier is the method for establishing a temporary electrical connection with contact locations on the die. These contact locations are typically pads such as bond pads or test pads located on the face of the die. With some carriers, the die is placed face down in the carrier and biased into contact with an interconnect. The interconnect contains the contact structure that physically contacts and forms an electrical connection with the die pads. Exemplary contact structures include wires, needles, and bumps. The mechanisms for making electrical contact include piercing the native oxide of the die pad with a sharp point, breaking or burnishing the native oxide with a bump, or scrubbing the native oxide with a contact adapted to move across the die pad.

These different contact structures are designed to establish an electrical connection with the bond pads of a die under test. Preferably this connection is low-resistance and ohmic. Low-resistance connotes a resistance that is negligible. An ohmic connection is one in which the voltage appearing across the connection is proportional to the current flowing for both directions of current flow. In the past it has been difficult to establish a low-resistance ohmic connection with bond pads while minimizing damage to the pads. A bond pad may only be about 1µ thick and is thus relatively easy to damage. In general, each of the above noted contact structures will displace the bond pad metallization and damage the pad.

In addition to forming a low-resistance ohmic connection, it is also desirable for a contact structure to be compliant in nature. Sometimes an arrangement of bond pads may present a sloped or irregular surface topography. This may be due to the mounting arrangement of the die in the carrier or to the uneven topography of the bond pads across the surface of the die. It is thus advantageous to form the interconnect with compliant contacts adapted to conform to the vertical location of the bond pad. In a similar manner, it is desirable for the contact to possess a resiliency which permits it to return to its original position for reuse.

OBJECTS OF THE INVENTION

In view of the foregoing, there is a need in the art for improved contact structures for testing and manufacturing semiconductor dice. Accordingly, it is an object of the present invention to provide a method for forming metal contact pins suitable for testing unpackaged semiconductor dice.

It is a further object of the present invention to provide an improved contact structure that can be used to form contacts for temporary interconnects and can also be used to form contacts on an active semiconductor dice.

It is yet another object of the present invention to provide an improved metal contact pin that is compliant, resilient and adapted to form a temporarily electrical connection with a bond pad without damage to the die.

Other objects, advantages, and capabilities of the present invention will become more apparent as the description proceeds.

SUMMARY OF THE INVENTION

In accordance with the present invention an improved contact structure and a method for forming the contact structure are provided. The contact structure, simply stated, comprises metal contact pins attached to a substrate. In a first embodiment of the invention the substrate is a silicon interconnect and the contact pins are attached to the interconnect in electrical communication with conductive traces. In a second embodiment, the substrate is an active semiconductor die and the contact pins are attached to die pads (e.g., bond pads, tests pads) on the die. In either case, the contact pins are suitable for forming an electrical connection with a mating contact location that is low-resistance and ohmic.

The contact pins are formed with a compliant structure to permit flexure as the contact pins are biased against the mating contact location to form an electrical connection. As an example, an interconnect having contact pins and a die having flat bond pads may be placed together in a test carrier. As the interconnect and die are biased together in the carrier, the contact pins on the interconnect form an electrical connection with the bond pads on the die. The compliant structure of the contact pins permits flexure to accommodate variations in the mating topographies. The compliant structure can include a flexible spring segment for the contact pins or an angled mounting arrangement for the contact pins. In addition, the contact pins can include a contact ball on the end to facilitate the formation of an electrical connection.

There are two preferred methods for attaching the contact pins to the die pads of a semiconductor die or to the substrate of an interconnect. These attachment methods are wire bonding and welding. During the attachment process, the contact pins are formed with a compliant structure, such as a spring segment, using localized heating and bending.

Localized heating and bending can be accomplished with a laser working in conjunction with a wire bonder or a welding tool. A heated capillary wire feed system can also be used to heat and bend the contact pins during the attachment process. The contact ball is preferably formed on an end of each contact pin at the completion of the attachment process.

BRIEF DESCRIPTION OF THE DRAWINGS

FIG. 2 is a schematic cross sectional drawing of contact pins wire bonded to a semiconductor die at an angle to provide a compliant contact structure;

FIG. 3A is a schematic view illustrating a contact pin having a compliant structure formed as a spring segment;

FIG. 3B is a schematic view illustrating a heating and shaping process for forming the contact pin of FIG. 3A which uses a laser and wire bonding tool;

FIG. 3C is a schematic view illustrating a heating and shaping process for forming the contact pin of FIG. 3A which uses a heated capillary tool;

FIGS. 4A and 4B illustrate alternate embodiment contact pins having compliant structures formed as spring segments;

DETAILED DESCRIPTION OF THE PREFERRED EMBODIMENT

Figure 1A:
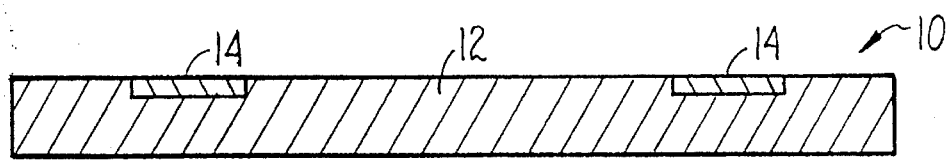
FIGS. 1A–1E are schematic cross sectional drawings illustrating the steps in forming contact pins on a semiconductor die in accordance with the invention using a wire bonding process.

Referring now to FIGS. 1A–1E the method of the invention is illustrated for forming contact pins on an active semiconductor die 10. As shown in FIG. 1A, the semiconductor die 10 is a conventional die that includes a silicon substrate 12 on which integrated circuits have been formed. Bond pads 14 are in electrical communication with the integrated circuits. During the manufacturing process the die 10 is fabricated on a wafer with a large number of other dice. Each die 10 on the wafer can subsequently be singulated by saw cutting.

The bond pads 14 of the die 10 are embedded in a passivation layer (not shown). The bond pads 14 are typically polygonal (e.g., square) metal pads, about 100 μm on a side, which are separated by a space of about 50 to 100 μm.

Typically, the bond pads 14 are formed of aluminum (Al) using a metallization process. Metals other than aluminum are sometimes used to form the bond pads on a semiconductor die but aluminum is most prevalent. The aluminum bond pads 14 are used for establishing an electrical connection between the integrated circuits on the die and the outside world. Depending on the application, an electrical connection to the bond pads is made using various methods such as wire bonding, tape automated bonding or flip chip bonding. The present invention allows this connection to be made using a contact pin formed with a compliant structure.

Figure 1B:
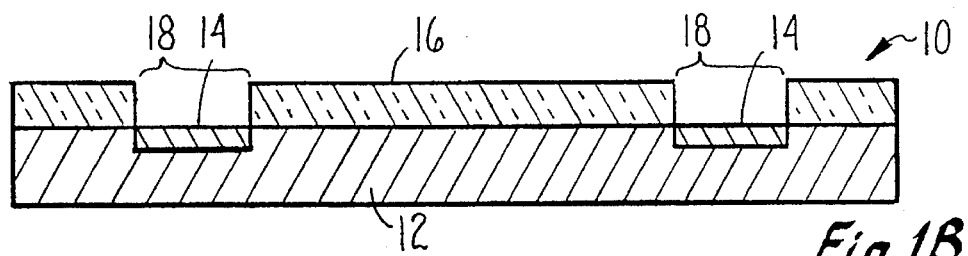

Initially, as shown in FIG. 1B, a layer of photoresist 16 is spun onto the wafer containing the die 10. The layer of photoresist 16 is exposed, developed and etched to form a mask having openings 18. The openings 18 are in alignment with the bond pads 14 and have the same peripheral configuration as the bond pads 14.

Figure 1C:
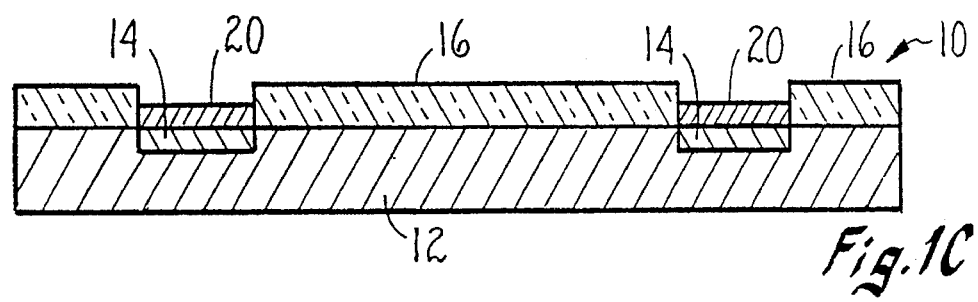

Next, as shown in FIG. 1C, an intermediate pad 20, formed of a conductive material such as copper, is deposited in the openings 18 and onto the bond pads 14. The intermediate pad 20 is on the order of 1 μm to 50 μm in thickness and is approximately the same size as the bond pads 14. The purpose of the intermediate pad 20 is to allow a solder pad 22 (FIG. 1D), formed of a solderable material such as nickel, to be attached to the aluminum bond pad 14. Although the solder pad 22 can be deposited directly to the aluminum bond pad 14, the intermediate pad 20 formed of a material such as copper, bonds more readily to the aluminum bond pad 14.

The intermediate pad 20 is deposited using an electroless electrolytic plating process. Various metal films including copper (Cu), nickel (Ni), gold (Au) and palladium (Pd) can be deposited through electroless deposition using aqueous solutions comprising metal ions and reducing agents. Electroless plating is often used to form contacts by filling a via with a deposited metal. As an example, in the present application for depositing Cu on Al, the aqueous base solution contains Cu++ ions and ascorbic acid reducing agents. The intermediate pad 20 is plated onto the bond pad 14 to a thickness that is less than the thickness of the layer of photoresist 16. This permits the same opening 18 to be used for a subsequent plating process.

Figure 1D:
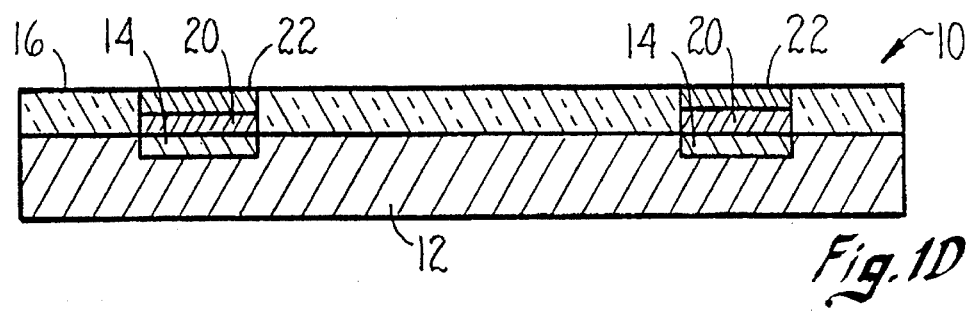

Next, as shown in FIG. 1D, the solder pad 22 is deposited on the copper pad 20. The solder pad 22 may also be deposited using an electroless plating process. As an example, an aqueous solution containing Ni+ ions and dimethy aminoborane reducing agents can be used to deposit a nickel solder pad 22. The solder pad 22 has a thickness of from 1 μm to 50 μm and an outer peripheral configuration that matches the intermediate pad 20 and the aluminum bond pad 14. The solder pad 22 is formed of a material that can be easily soldered such as nickel, nickel alloys or gold.

Figure 1E:
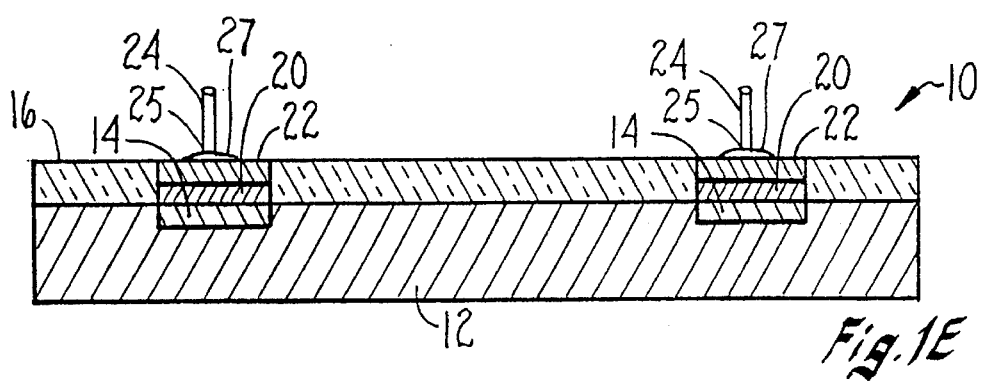

Next, as shown in FIG. 1E, a contact pin 24 is attached to the solder pad 22. The contact pin 24 is formed of wire having a thickness of about 1 to 5 mils. Suitable materials for the contact pin 24 include copper, gold, nickel alloys and spring steel alloys. The contact pin 24 is attached to the solder pad 22 using a wire bonding apparatus. The contact pin 24 may be bonded directly to the solder pad 22 or a solder material 25 may be used during the wire bonding process.

Wire bonding apparatus are well known in the art. Wire bonding apparatus are manufactured by Kulicke and Soffa Industries, Inc., Horsham, Pa. and Mitsubishi Denki, Japan. U.S. Pat. No. 3,894,671 to Kulicke, Jr. et al. and U.S. Pat. No. 4,877,173 to Fujimoto et al. disclose representative wire bonding apparatus.

During the wire bonding process the end of the wire which forms the base 25 (FIG. 1E) of the contact pin 24, is heated by an electrical discharge or a hydrogen torch to a molten state. This forms a ball of molten metal on the base 25 of the contact pin 24. The molten ball is then pressed by a bonding tool against the solder pad 22. Ultrasonic vibrations are also applied to the molten ball as it is pressed against the solder pad 22. This mechanically bonds the wire to the solder pad 22. The wire is then electrically opened or sheared to form the contact pin 24.

Following the wire bonding process the layer of photoresist 16 can be stripped from the substrate 12. Depending on the photoresist formulation this can be accomplished using a suitable wet chemical stripper. In addition, a protective layer (not shown) can then be applied to the substrate 12 to protect the surface of the substrate and limit the stresses applied to the contact pin substrate interface from the motion of the contact pins 24.

With reference to FIG. 2, a compliant structure can be achieved by positioning the contact pin 24A at an acute angle with respect to the plane of the substrate 12. The contact pin 24 is thus able to flex as indicated by arrows 26 as it is biased against a mating component (e.g., a contact on a printed circuit board). The contact pin 24A may be positioned at an angle by appropriate manipulation of the bonding tool of the wire bonding apparatus.

With reference to FIGS. 3A and 3B, a technique for forming another compliant contact structure for a contact pin 24B is shown. As shown in FIG. 3A, the contact pin 24B includes a compliant structure formed as a spring segment 34. In addition, the contact pin 24B includes a contact ball 32 on the end. The contact ball 32 facilitates electrical connection of the contact pin 24B with a mating contact location, such as a pad, formed on an interconnect or other substrate (e.g., circuit board).

FIG. 3B illustrates a process for forming the shaped contact pin 24B with a compliant spring segment 34. In an automated wire bonding apparatus, movement of a wire bonding tool 26 in the x, y and z directions is under computer control. Using appropriate software, the wire bonding tool 26 can be moved in a path to manipulate a length of wire to form the spring segment 34 (FIG. 3A). The spring segment 34 includes a flat s-shaped segment as shown, or may be formed with multiple coils twisted into a spiral. At the same time that the wire bonding tool 26 is moving a length of wire through a specified path, a laser 28 focused through a lens 30 initiates localized heating of the wire. This softens the wire material so that it can be formed into the desired shape, which upon cooling will be permanent. The laser 28 or an electrical discharge arrangement or separate shearing member, is then operated to clip the wire. The contact ball 32 (FIG. 3A) is formed using the laser 28 to heat the end of the contact pin 24B and form a molten ball. Alternately, the electrical discharge arrangement or a hydrogen torch can be used to form the contact ball 32 (FIG. 3A) at the end of the contact pin 24B.

FIG. 3C illustrates another technique for heating and shaping a length of wire using a heated capillary wire feed system. This technique is essentially the same as that previously explained for FIG. 3B. In this case, a capillary tool 33 having a heating element 31 is moved in a path to manipulate the length of wire for shaping. One suitable heated capillary tool 33 is manufactured by Kulicke and Soffa Industries, Inc., 507 Prudential Road, Horsham, Pa 19044 and is a component of a wire bonding apparatus.

FIGS. 4A and 4B illustrate alternate embodiment contact pins 24C and 24D. In FIG. 4A, the contact pin 24C is formed with a spring segment 38 that has multiple s-shaped segments. In FIG. 4B a contact pin 24D is formed with a spring segment 40 having multiple s-shaped segments that are wider at the base. In each case the spring segment 38 may be flat, as shown or formed with a spiral twist.

Referring now to FIGS. 5A–5E an alternate embodiment process for forming contact pins on the semiconductor die 10 is shown. The alternate embodiment process attaches contact pins 24W (FIG. 5E) to the bond pads 14 of the die 10 using welding rather than wire bonding.

Initially a shorting layer 36 is blanket deposited over the substrate 12 and bond pads 14 of the semiconductor die 10. The shorting layer 36 is preferably formed of a highly conductive material such as copper. Other suitable materials include nickel or aluminum. The shorting layer is deposited using a suitable metallization process such as electrolytic plating, chemical vapor deposition or sputtering. The shorting layer 36 functions as an electrical path for a welding current. This helps to shunt the welding current away from the integrated circuits which may be adversely affected by the.

Figure 5A:
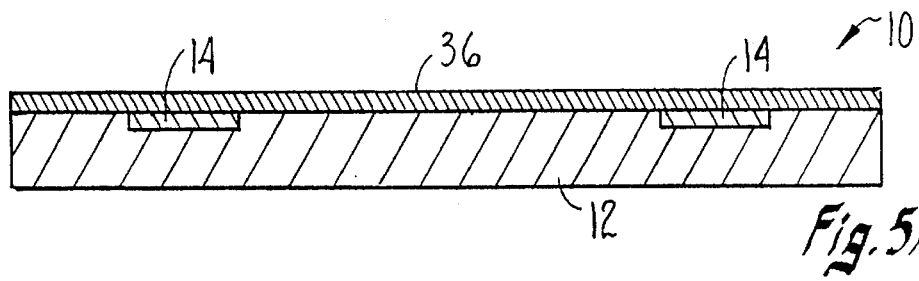
FIGS. 5A–5E are schematic cross sectional drawings illustrating steps in forming contact pins on a semiconductor die in accordance with the invention using a welding process.
Figure 5B:
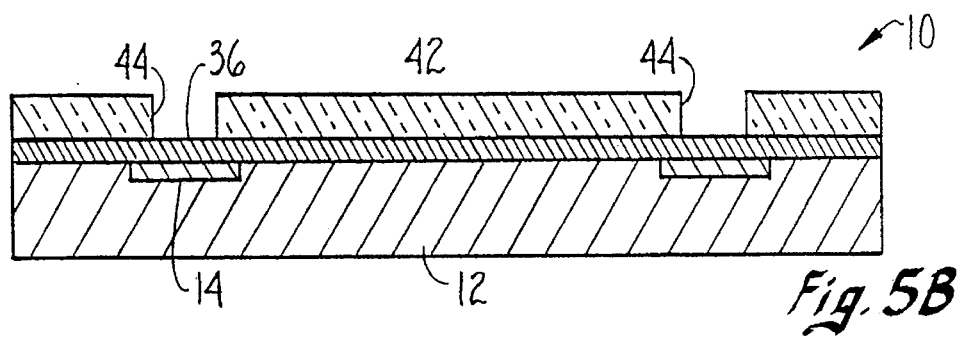

Next, as shown in FIG. 5B, a layer of photoresist 42 is deposited on the shorting layer 36. The layer of photoresist 42 is developed and etched to form a mask having a pattern of openings 44. Each opening 44 extends through the layer of photoresist 42 to the shorting layer 36 and is aligned with a bond pad 14 of the die 12.

Figure 5C:
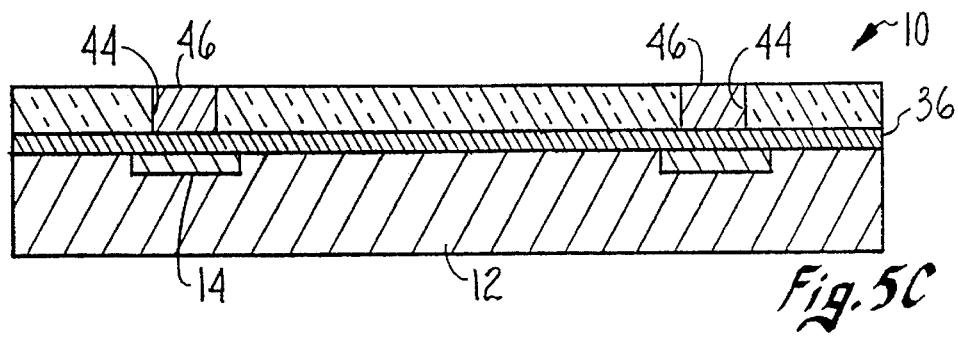

Next, as shown in FIG. 5C weld pads 46 are deposited in the openings 44 and onto the shorting layer 36. The weld pads 46 are deposited using an electroless deposition process as previously described. The weld pads 46 are formed of a material that can be easily welded. Suitable materials include nickel, gold and copper.

Figure 5D:
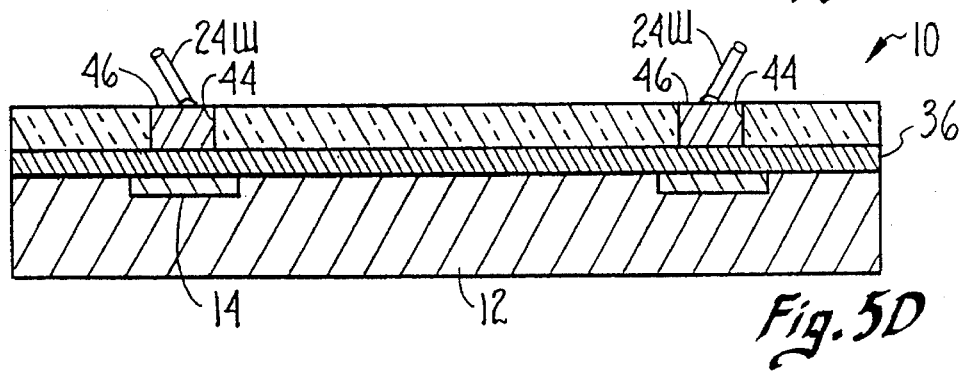

Next as shown in FIG. 5D, contact pins 24W are welded to the weld pads 46 using a welding process. In some embodiments the weld pads 46 are not required as the contact pins 24W can be welded directly to the shorting layer. Welding apparatus for semiconductor manufacture are similar in construction to wire bonding apparatus and are used for the same purposes. Suitable welding apparatus are manufactured by the previously identified wire bonder manufactures. With minor modifications to the electrical circuitry, flame-off components and grounding of the workholder, such a wire bonding apparatus can be modified to perform the functions previously outlined in FIGS. 3D and 3C (i.e., heating and shaping).

In general, a welding apparatus uses an electric current to generate the heat necessary to form molten material at the interface of two metals. For the present application the welding current is passed through the contact pins 24W and to the weld pads 46. The shorting layer 36 provides a closed loop to carry the current through all of the weld pads 46 formed on the die 10. The welding current forms molten metal at the interface of each contact pin 24W and its respective weld pad 46 and bonds these elements together.

Figure 5E:
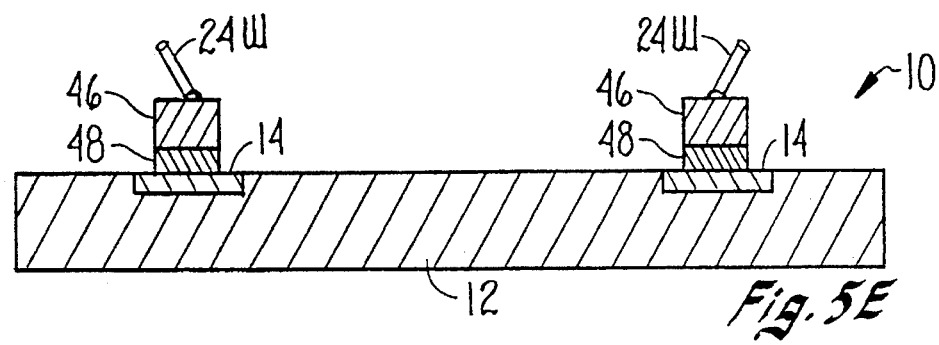

Next as shown in FIG. 5E, the layer of photoresist 42 is stripped. In addition, the shorting layer 36 is patterned and etched so that base pads 48 are formed. This forms a stacked structure on each aluminum bond pad 14 which includes the base pad 48, the weld pad 46 and the welded contact pin 24W. In addition, a protective layer (not shown) can be applied to protect the surface of the substrate 12 and limit the stresses applied to the contact pin-weld spot interface from the motion of the contact pin 24W. During the welding process, the contact pins 24W can be angled to form a compliant structure as previously described. In addition, compliant structures comprising spring segments may be formed substantially as previously described by simultaneously heating and moving a length of wire which forms the contact pin 24W.

Figure 6A:
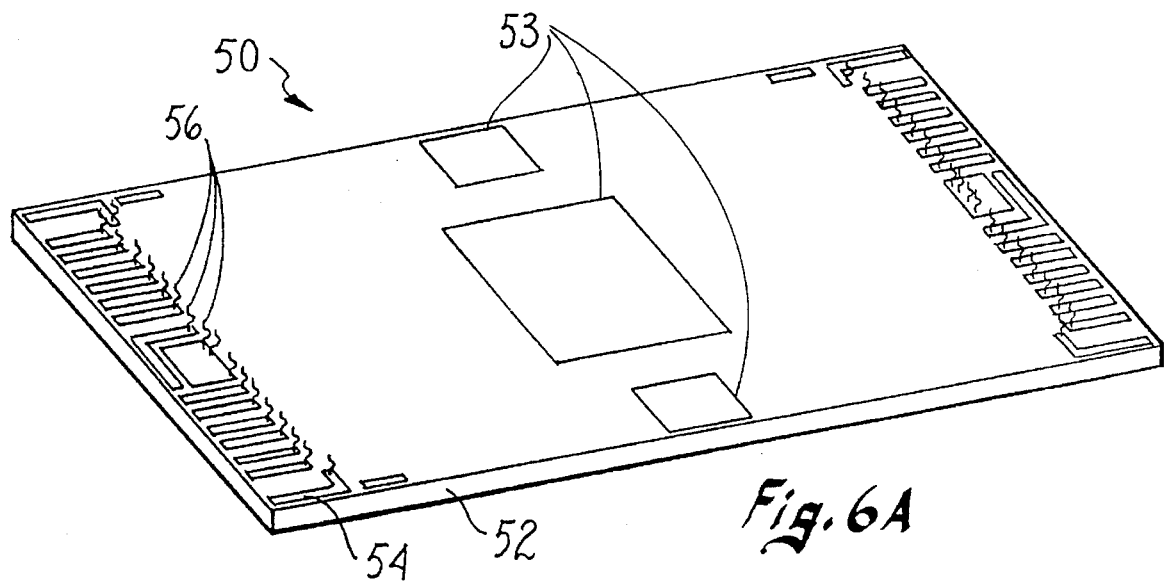
FIG. 6A is a perspective view of an interconnect having contact pins formed in accordance with the invention.
Figure 6B:
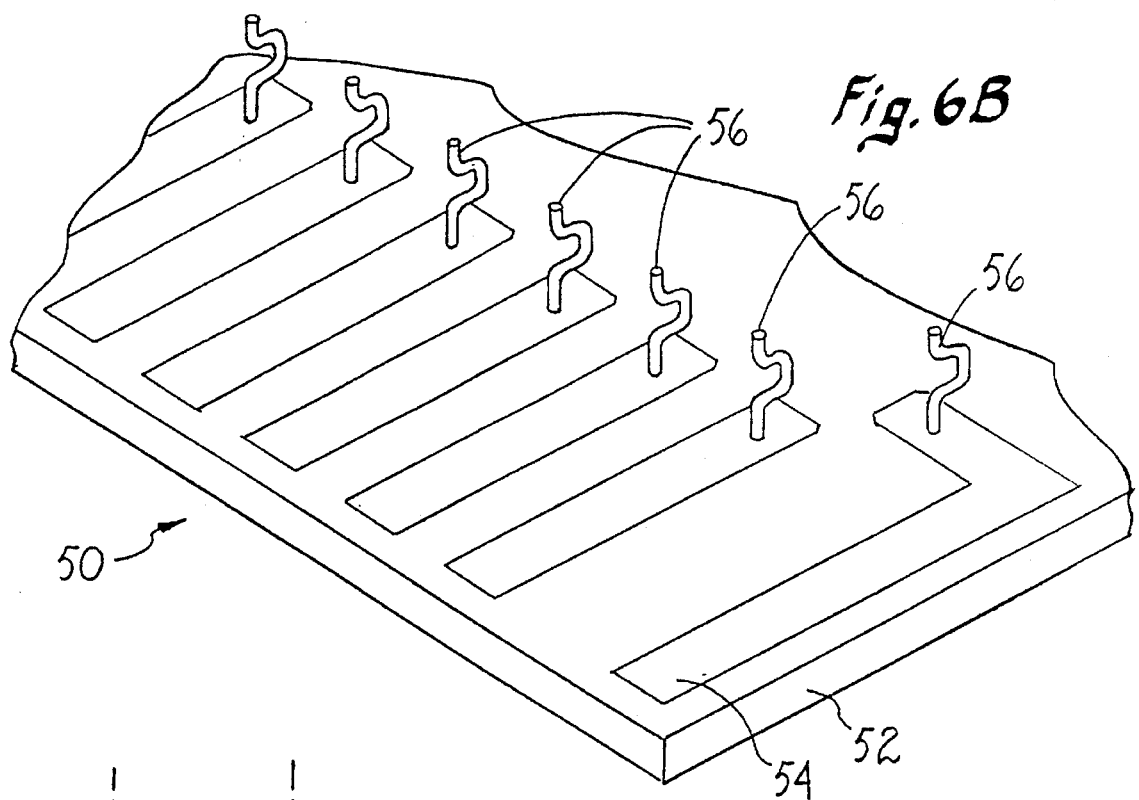
FIG. 6B is an enlarged view of a portion of FIG. 6A.

Referring now to FIGS. 6A and 6B, an interconnect 50 having contact pins 56 formed in accordance with the invention is shown. The interconnect 50 includes a substrate 52 and a pattern of circuit traces 54 formed on the substrate 52 as an aid in constructing and subsequently using the interconnect 50. The circuit traces 54 can be formed by depositing and patterning a conductive metal. A pattern of alignment fiducials 53 is also formed on the substrate 52.

A preferred material for the substrate 52 is silicon which will have the same coefficient of thermal expansion as a silicon die. Other suitable materials include ceramic and silicon on sapphire. The interconnect 50 is adapted for use with a carrier for testing bare or unpackaged semiconductor dice. The interconnect 50 is adapted to establish temporary electrical communication between a semiconductor die retained in the carrier and external test circuitry. U.S. Pat. No. 5,302,891 to Wood et al. entitled "Discrete Die Burn-In For Nonpackaged Die" discloses a carrier that uses an interconnect.

In use, the interconnect 50 is placed within a test carrier, along with a die, and the contact pins 56 formed on the interconnect 50 are placed in contact with the bond pads on the die to establish an ohmic contact. The circuit traces 54 of the interconnect are then placed in electrical communication with external test circuitry. As an example, the circuit traces 54 may be wire bonded to external connectors on the carrier which connect to the test circuitry.

Figure 6C:
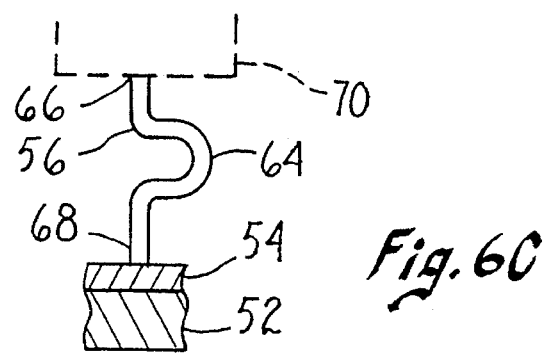
FIG. 6C is an enlarged cross sectional view of a contact pin mating with a flat bond pad on a semiconductor die to establish an electrical connection.

As shown in FIG. 6B, the contact pins 56 are formed on the circuit traces 54. The circuit traces 54 are formed of a conductive material such as a thick film metal which is patterned as it is deposited on the substrate 52 (e.g., screen printing). As shown in FIG. 6C, the contact pin 56 includes a c-shaped segment 64. In addition, the contact pin 56 includes a base portion 68 that attaches to the circuit trace 54 and a tip portion 66 adapted to contact a bond pad 70 of a die under test. The contact pins 56 may be formed substantially as previously described using a wire bonding process or a soldering process. Exemplary dimension for the contact pins include a diameter of 1 to 5 mils and a height of from 3 to 10 mils.

Figure 7A:
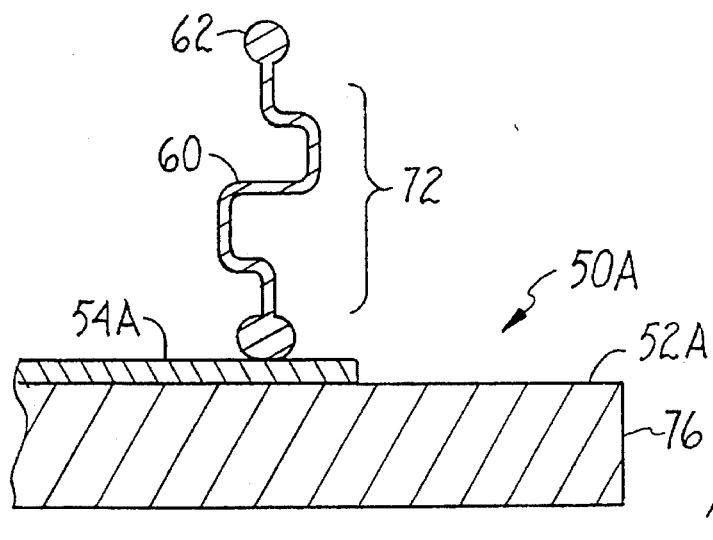
FIG. 7A is a schematic drawing illustrating a portion of an interconnect having contact pins formed in accordance with the invention with a spring segment.
Figure 7B:
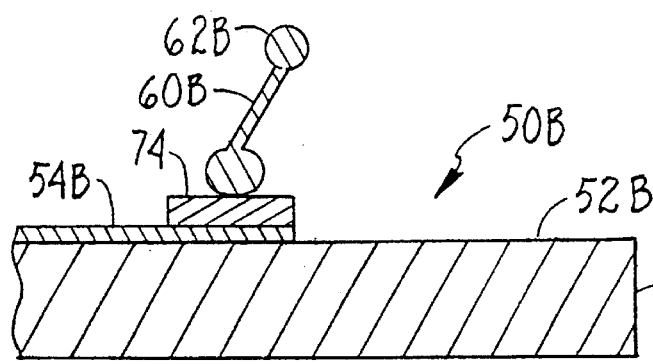
FIG. 7B is a schematic drawing illustrating a portion of an interconnect having contact pins formed in accordance with the invention and mounted at an angle with respect to a substrate of the interconnect to provide a compliant structure.

Referring now to FIGS. 7A–7C, alternate embodiment interconnects having contact pins formed in accordance with the invention are shown. In FIG. 7A, an interconnect 50A includes a silicon substrate 52A, a circuit trace 54A and a contact pin 60. The contact pin 60 is formed on the circuit trace 54A using a wire bonding process substantially as previously described. The contact pin 60 includes a base portion 76 attached to the circuit trace 54A, a spring segment 72 and a contact ball 62 formed on the end for contacting a bond pad of a die under test. The ball 62 is formed using a gas flame (e.g., hydrogen gas) or electrical discharge as previously described.

In FIG. 7B an interconnect 50B includes a silicon substrate 52B, a circuit trace 54B and contact pin 60B. In addition, the contact pin 60B includes a base portion 78 and a contact ball 62B for contacting the bond pad of a die under test. In this case, a compliant structure is achieved by attaching the contact pin 60B at an acute angle to the substrate 52B. In other words, the axis of the contact pin 60B is situated at an acute angle with respect to the plane of the substrate 52B. Furthermore, contact pin 60B rather than being attached directly to the circuit trace 54B, attaches to the circuit trace via a bond site 74 formed on the circuit trace 54B. The bond site 74 is a conductive layer, preferably a metal such as nickel, that is plated or deposited on the circuit trace 54B. As before, the contact ball 62B is formed using a gas flame or electrical discharge.

Figure 8:
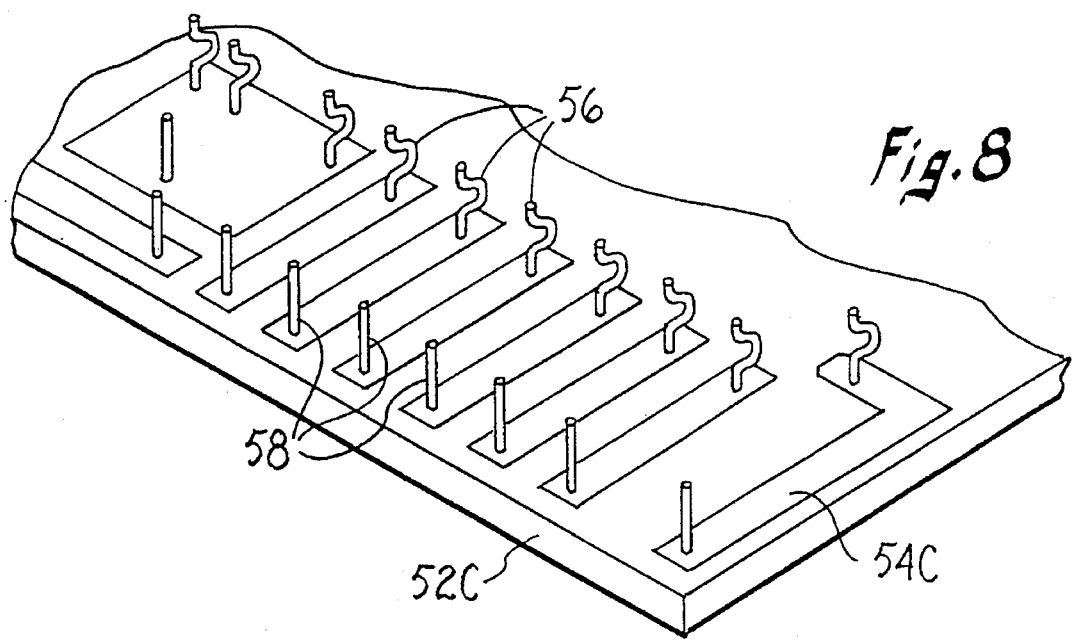
FIG. 8 is a perspective view of an interconnect having two different embodiments of contact pins formed in accordance with the invention.

In FIG. 8, an interconnect 50C includes a silicon substrate 52C, circuit traces 54C formed on the substrate 52C and two types of contact pins 56 and 58 formed on the circuit traces 54C. The contact pins 56 have been previously described. Contact pins 58 are straight pins adapted for connection to a socket or female member. In use of the interconnect 50C in a test carrier for a die under test, the contact pins 56 are placed in contact with contact locations on the die. Contact pins 58 are placed in contact with external test circuitry.

Thus the invention provides a method for forming contact pins suitable for use as contacts on active semiconductor dice or contacts on interconnects useful for testing unpackaged semiconductor dice. The contact pins preferably include a compliant structure to permit flexure during the formation of an electrical connection with a contact location on a mating component.

Although the invention has been described in terms of preferred embodiments, it is intended that alternate embodiments of the inventive concepts expressed herein be included within the scope of the following claims.

What is claimed is:

1. A method for forming a contact structure on an interconnect, said contact structure adapted to establish an electrical connection with a contact location on a semiconductor die, said method comprising:

providing a substrate;

attaching a wire to the substrate using a method selected from the group consisting of wire bonding and welding;

heating and shaping the wire into a compliant structure during said attaching step; and severing the wire to form a contact pin.

2. The method as claimed in claim 1 and wherein:

heating and shaping the wire is with a laser and a wire bonder tool manipulated to bend the wire into a predetermined shape.

3. The method as claimed in claim 1 and wherein:

heating and shaping the wire is with a heated capillary tube.

4. The method as claimed in claim 1 and wherein:

the wire is shaped to include a spring segment.

5. The method as claimed in claim 1 and wherein:

the wire is shaped with a contact ball on an end thereof.

6. A method for forming a contact pin for an interconnect, said contact pin adapted to establish an electrical connection with a contact location on a semiconductor die, comprising:

forming a substrate;

forming a conductive trace on the substrate;

attaching a metal pin to the substrate in electrical communication with the conductive trace said metal pin formed of a wire that is attached to the substrate using an attachment method selected from the group consisting of wire bonding and welding;

heating and shaping the wire as it is attached to the substrate to form a compliant spring segment; and following heating and shaping of the wire severing the wire.

7. The method as claimed in claim 6 and wherein;

the compliant spring segment is c-shaped.

8. The method as claimed in claim 6 and wherein:
the compliant spring segment is s-shaped.

9. The method as claimed in claim 6 and wherein:
the spring segment is wider at a base.

10. The method as claimed in claim 6 and wherein:
the wire is attached to the substrate at an acute angle with respect to a plane of the substrate.

11. The method as claimed in claim 6 and further comprising:
forming a contact ball on an end of the length of wire.

12. A method for forming a contact pin for an interconnect, said contact pin adapted to establish an electrical connection with a contact location on a semiconductor die, comprising:
forming a substrate;
forming a conductive trace on the substrate;
attaching a metal pin to the substrate in electrical communication with the conductive trace, said metal pin formed of a wire that is wire bonded to the substrate;
heating and shaping the wire as it is wire bonded to form a compliant spring segment; and then
severing the wire.

13. The method as claimed in claim 12 and wherein;
heating and shaping the wire is by manipulating a wire bonding tool while a laser heats the wire.

14. The method as claimed in claim 12 and wherein:
heating and shaping the wire is by manipulating a capillary tube having a heating element.

15. The method as claimed in claim 12 and wherein:
the spring segment is attached to the substrate at an acute angle with respect to a plane of the substrate.

16. The method as claimed in claim 12 and wherein:
the spring segment is wider at a base than at a tip.

17. The method as claimed in claim 12 and further comprising:
forming a ball on an end of the wire.

18. The method as claimed in claim 12 and wherein:
the conductive trace includes a bond site and the wire is wire bonded to the bond site.

19. A method for forming a contact structure on a semiconductor die, said die including a substrate with integrated circuitry and a die pad in electrical communication with the integrated circuitry, said method comprising:
forming a solder pad on the die pad;
attaching a metal wire to the solder pad using a wire bonding process;
heating and shaping the wire into a compliant structure during said wire bonding process; and
after shaping the wire, severing the wire to form a compliant contact pin on the die pad.

20. The method as claimed in claim 19 and wherein:
the metal wire is attached to the substrate at an acute angle with respect to a plane of the substrate to provide the compliant structure.

21. The method as claimed in claim 19 and further comprising:
heating and shaping the metal wire with a spring segment as it is attached to the solder pad to provide the compliant structure.

22. The method as claimed in claim 19 and further comprising:
forming a contact ball on an end of the metal wire.

23. The method as claimed in claim 19 and wherein:
heating the metal wire is with a laser and shaping the metal wire is by manipulating a wire bonding tool.

24. The method as claimed in claim 19 and wherein:
heating and shaping the metal wire is with a heated capillary tool.

25. A method for forming a contact structure on a semiconductor die having a plurality of die pads in electrical communication with integrated circuitry formed on the die, said method comprising:
forming a mask on the substrate having an opening aligned with the die pads;
forming a shorting layer on the substrate to electrically connect the die pads;
forming welding pads in the openings in electrical contact with the die pads;
attaching metal wires to the welding pads using a welding process;
heating and shaping the metal wires during the welding process into a compliant structure;
severing the metal wire to form contact pins; and
removing the shorting layer except in an area in contact with the welding pads.

26. The method as claimed in claim 25 and wherein:
the metal wires are attached to the substrate at an acute angle with respect to a plane of the substrate.

27. The method as claimed in claim 25 and wherein:
the contact pins are formed with a spring segment during the heating and shaping step.

28. The method as claimed in claim 25 and further comprising:
forming a ball on an end of the contact pins.

29. The method as claimed in claim 25 and wherein:
heating the metal wire is with a laser.

30. The method as claimed in claim 25 and wherein:
heating and shaping the metal wire is with a heated capillary tool.

* * * * *